(12) United States Patent
Akiyama et al.

(10) Patent No.: US 7,794,350 B2
(45) Date of Patent: Sep. 14, 2010

(54) TURNING DEVICE FOR HEAVY OBJECT

(75) Inventors: Shuji Akiyama, Nirasaki (JP);
Toshihiro Yudate, Tsu (JP); Hiroshi Yamada, Nirasaki (JP); Nobuhiro Kameda, Nirasaki (JP)

(73) Assignees: Tokyo Electron Limited, Tokyo (JP);
Nabtesco Corporation, Tokyo (JP)

( * ) Notice: Subject to any disclaimer, the term of this patent is extended or adjusted under 35 U.S.C. 154(b) by 624 days.

(21) Appl. No.: 10/590,176

(22) PCT Filed: Mar. 23, 2005

(86) PCT No.: PCT/JP2005/006194

§ 371 (c)(1),
(2), (4) Date: Oct. 5, 2006

(87) PCT Pub. No.: WO2005/093820

PCT Pub. Date: Oct. 6, 2005

(65) Prior Publication Data
US 2007/0258799 A1    Nov. 8, 2007

(30) Foreign Application Priority Data
Mar. 25, 2004  (JP) .............................. 2004-088594
Mar. 23, 2005  (JP) .............................. 2005-082968

(51) Int. Cl.
*F16H 3/70* (2006.01)
(52) U.S. Cl. ...................................... 475/178
(58) Field of Classification Search ............... 475/178
See application file for complete search history.

(56) References Cited

U.S. PATENT DOCUMENTS 5,222,409 A * 6/1993 Dalakian .................. 74/479.01
5,886,488 A   3/1999 Nakajima et al.

FOREIGN PATENT DOCUMENTS

| JP | 7-215427   | 8/1995  |
|----|------------|---------|
| JP | 8-110367   | 4/1996  |
| JP | 9-298224   | 11/1997 |
| JP | 2002-010578| 1/2002  |

* cited by examiner

*Primary Examiner*—Sherry L Estremsky
*Assistant Examiner*—Erin D Bishop
(74) *Attorney, Agent, or Firm*—Jordan and Hamburg LLP

(57) ABSTRACT

A compact turning device for a heavy object, comprising a turning arm joined to the heavy object and a drive device drivingly turning the turning arm. The drive device further comprises a motor incorporating a rotor shaft connected to the rotating input part of a planetary gear type speed reducer on a same axis (A). Also, the turning arm is installed by joining its first plane to the plane of the planetary gear type speed reducer forming the rotating output part and its second plane orthogonal to the first plane to the heavy object. The turning arm and the drive device are disposed within the width (D) of the heavy object in the axis (A) direction of the turning pivot of the turning arm. The planetary gear type speed reducer of the drive device may be disposed in two front and rear stages.

5 Claims, 6 Drawing Sheets

TURNING DEVICE FOR HEAVY OBJECT

TECHNICAL FIELD

The present invention relates to a turning device for a heavy object which is applied to a probe device and the like for measuring electrical characteristics of a body to be examined, such as a semiconductor device, and which turns a heavy object, such as a test head.

BACKGROUND ART

Conventional examination equipment, for example, a probe device is provided with a loader section having a conveyance mechanism for conveying semiconductor wafers one by one and a prober section for continuously electrically inspecting the semiconductor wafers. The prober section is provided with a mounting block for delivering and receiving the semiconductor wafers to/from the conveyance mechanism one by one, a probe card disposed above the mounting block, and a test head for electrically interrupting a section between the probe card and a tester. The test head is fixed on a rotating shaft through a test head frame and a hinge and is structured so as to obtain, for example, a 180-degree turn between the probe device body and a maintenance area around the rotating shaft. Recently, the test head has become larger in size to weigh 600 to 800 kg. In many cases, a motor is used to turn such a test head as a heavy object. Japanese Patent Laid-Open Publication No. Hei 9-298224 discloses almost the same prior art as the foregoing conventional one.

However, in the case of such a structure where a motor and a gear support the weight of a test head as seen in conventional examination equipment such as a probe device, the gear for transmitting a driving force of the motor unavoidably becomes larger in size and the gear is apt to have a multi-stage structure, thus causing the equipment to be complicated and expensive. Furthermore, there are also the following problems: turning the test head around the enlarged gear makes it difficult to reduce the turning radius and requires an increase in an installation space for the probe device.

DISCLOSURE OF THE INVENTION

In view of the above-described problems, it is an object of the present invention to provide a turning device for a heavy object with a minimum number of parts to be used without need for use of a large gear.

To achieve the above-mentioned object, according to a first aspect of the present invention, there is provided a turning device for a heavy object comprising: a turning arm joined to the heavy object and turning around a turning pivot on the axial line and a drive device for driving turning operations of the turning arm wherein: the drive device is composed of: a fixing section, a turning input section, a turning output section having an orthogonal plane orthogonal to the axial line of the turning pivot, a planetary gear type speed reducer with a pair of ball bearings disposed between the fixing section and the turning output section and a motor including a rotor shaft coaxially connected to a stator having a coil and the turning input section of the planetary gear type speed reducer; the turning arm has a first plane connected to the plane of the turning output section and a second plane connected to the heavy object, positioned nearer to the heavy object from the axial line of the turning pivot and orthogonal to the first plane; and the turning arm and the drive device are disposed within a width of the heavy object in the axial direction of the turning pivot.

According to a second aspect of the present invention, in the turning device of the first aspect, the center position in the axial line direction of the turning pivot of the heavy object is positioned within a distance between one of the pair of main bearings and an intersection obtained by crossing the axial line of the turning pivot with a line at a bearing contact angle to the perpendicular line of the main bearing as one ball bearing positioned on the orthogonal plane side of the rotation output section of the ball bearings.

According to a third aspect of the present invention, in the turning device of the first aspect, a previous-stage speed reducer as a previous-stage reduction gear mechanism is disposed between the planetary gear type speed reducer and the motor; an input rotation section of the previous-stage speed reducer and the rotor shaft of the motor are coaxially coupled to each other; and the output rotation section of the previous-stage reducer and the input rotation section of the planetary gear type speed reducer are coaxially coupled to each other.

According to a fourth aspect of the present invention, in the turning device of the first aspect, a supporting block for fixing the planetary gear type speed reducer and a frame for mounting the supporting block are provided; the fixing section of the planetary gear type speed reducer has a circular outside-diameter section and a mounting flat surface parallel to the plane of the rotation output section; the supporting block includes a first mounting surface for mounting the mounting flat surface of the fixing section of the planetary gear type speed reducer, a second mounting surface for mounting the frame and orthogonal to the first mounting surface and a pair of rib sections for connecting both ends of the first mounting surface in the outward direction with both ends of the second mounting surface in the outward direction; and the outside-diameter section of the mounting flat surface of the fixing section of the planetary gear type speed reducer is cut so that the pair of ribs may be shorter than the circular outside diameter.

According to a fifth aspect of the present invention, in a turning device comprising: a turning arm joined to a heavy object and turning around a turning pivot on the axial line and a drive device for driving turning operations of the turning arm wherein: the drive device includes a fixing section, a rotation input section, a rotation output section having an orthogonal plane orthogonal to the axial line of the turning pivot, a planetary gear type speed reducer having a pair of ball bearings disposed between the fixing section and the rotation output section, and a motor disposed coaxially to the rotation input section of the planetary gear type speed reducer; the turning arm has a first plane joined to the plane of the rotation output section and a second plane orthogonal to the first plane; and the turning arm and the drive device are disposed within a width of the heavy object in the axial direction of the turning pivot.

The turning device for a heavy object according to the present invention, being structured as described above, has the following advantages:

The first aspect of the present invention provides a turning device for a heavy object comprising: a turning arm joined to the heavy object and turning around a turning pivot on the axial line and a drive device for driving turning operations of the turning arm wherein: the drive device is composed of: a fixing section, a turning input section, a turning output section having an orthogonal plane orthogonal to the axial line of the turning pivot, a planetary gear type speed reducer with a pair of ball bearings disposed between the fixing section and the turning output section and a motor including a rotor shaft coaxially connected to a stator having a coil and the turning input section of the planetary gear type speed reducer; the turning arm has a first plane connected to the plane of the turning output section and a second plane connected to the heavy object, positioned nearer to the heavy object from the axial line of the turning pivot and orthogonal to the first plane; and the turning arm and the drive device are disposed within a width of the turning pivot of the heavy object in the axial direction.

Such a configuration provides a compact turning device for a heavy object which permits the turning arm and the drive device to be positioned within a width of the heavy object in the axial direction of the turning pivot by reducing a distance between the center of gravity of the heavy object and the axial line A of the turning pivot.

The second aspect of the present invention provides a turning device for a heavy object of the first aspect wherein: the center position in the axial line direction of the turning pivot of the heavy object is positioned within a distance between one of the pair of main bearings and an intersection obtained by crossing the axial line of the turning pivot with a line at a bearing contact angle to the perpendicular line of the main bearing as one ball bearing positioned on the orthogonal plane side of the rotation output section of the ball bearings.

Such a configuration provides a turning device for a heavy object capable of stably turning the heavy object without excessive swinging by supporting the heavy object in a cantilever manner.

The third aspect of the present invention provides a turning device for a heavy object of the first aspect wherein: a previous-stage speed reducer as a previous-stage reduction gear mechanism is disposed between the planetary gear type speed reducer and the motor; an input rotation section of the previous-stage speed reducer and the rotor shaft of the motor are coaxially coupled to each other; and the output rotation section of the previous-stage reducer and the input rotation section of the planetary gear type speed reducer are coaxially coupled to each other.

Such a configuration provides a turning device for a heavy object capable of further reducing a turning radius by reducing the outside diameters of the reducer and the motor because of a high reduction ratio by use of a double speed reduction mechanism.

The fourth aspect of the present invention provides a turning device for a heavy object of the first aspect wherein: a supporting block for fixing the planetary gear type speed reducer and a frame for mounting the supporting block are provided; the fixing section of the planetary gear type speed reducer has a circular outside-diameter section and a mounting flat surface parallel to the plane of the rotation output section; the supporting block includes a first mounting surface for mounting the mounting flat surface of the fixing section of the planetary gear type speed reducer, a second mounting surface orthogonal to the first mounting surface for mounting the frame and a pair of rib sections for connecting both ends of the first mounting surface in the outward direction with both ends of the second mounting surface in the outward direction; and the outside-diameter section of the mounting flat surface of the fixing section of the planetary gear type speed reducer is cut so that the pair of ribs may be shorter than the circular outside diameter.

Such a configuration provides a turning device for a heavy object capable of reinforcing the first mounting surface and the second mounting surface of the supporting block by the pair of rib sections to make the supporting block robust, without lengthening a section between the second plane of the turning arm and the axial line of the turning pivot, or without increasing the turning radius of the heavy weight because the pair of rib sections at the mounting flat surface outside diameter section of the fixing section of the planetary gear type speed reducer are cut short.

The fifth aspect of the present invention provides a turning device comprising: a turning arm joined to a heavy object and turning around a turning pivot on the axial line and a drive device for driving turning operations of the turning arm wherein: the drive device includes a fixing section, a rotation input section, a rotation output section having an orthogonal plane orthogonal to the axial line of the turning pivot, a planetary gear type reducer having a pair of ball bearings disposed between the fixing section and the rotation output section, and a motor disposed coaxially to the rotation input section of the planetary gear type speed reducer; the turning arm has a first plane joined to the plane of the rotation output section and a second plane orthogonal to the first plane; and the turning arm and the drive device are disposed within a width in the axial direction of the turning pivot of the heavy object.

Such a configuration provides a compact turning device for a heavy object which permits the turning arm and the drive device to be positioned within the width of the turning pivot of the heavy object.

DETAILED DESCRIPTION OF THE PREFERRED EMBODIMENTS

The embodiment of a turning device for a heavy object according to the present invention will be more particularly described with reference to the accompanying drawings.

Figure 1:
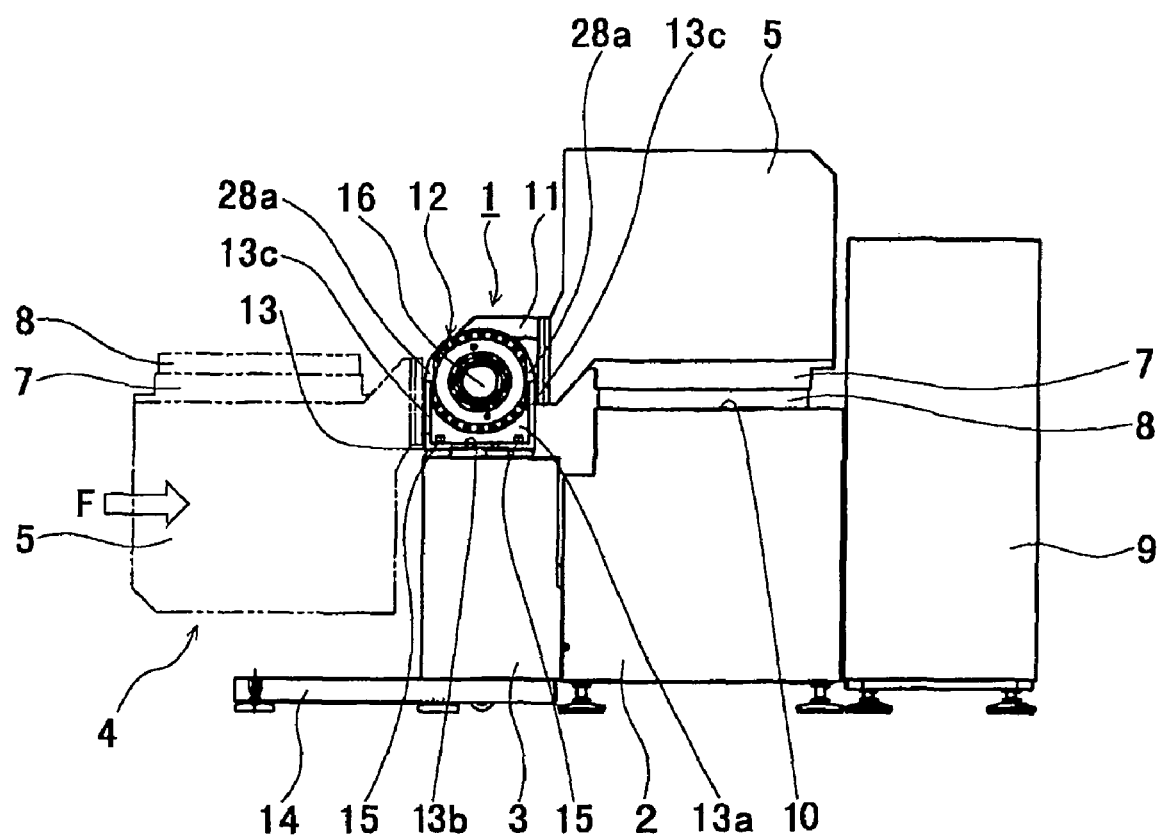
FIG. 1 is an elevation view showing an example of a turning device for a heavy object according to the present invention.

A probe device 1, for example, as shown in FIG. 1, is composed of a probe device body constituting a prober section which performs electrical examination for a body 2 to be examined, such as a semiconductor wafer, hereinafter referred to as a "device body", a frame 3 disposed adjacent to the left side of the device body 2, a test head 5 as a heavy object turned by approximately 180 degrees between the device body 2 and a maintenance area 4 by the frame 3, a coupling ring 7 and a probe card 8. To the immediate right of the device body 2, there is disposed a semiconductor wafer transfer apparatus 9 which stores semiconductor wafers by cassette and loads and unloads the semiconductors into/from the prober section one by one from the cassette.

A central hole (not shown) in a head plate 10 constituting a top face of the device body 2 is attached with a probe cover 8. The test head 5 is structured so as to be electrically connected to a coupling terminal on the top of the probe card 8 through the coupling ring 7 when the test head 5 turns and is positioned on the device body 2. Therefore, for example, the probe device 1 receives a test signal from a tester at an electrode of the semiconductor wafer on a mounting block 5 through the test head 5 and a probe pin of the probe card 8 to electrically examine respective IC chips of the semiconductor wafers.

Figure 2:
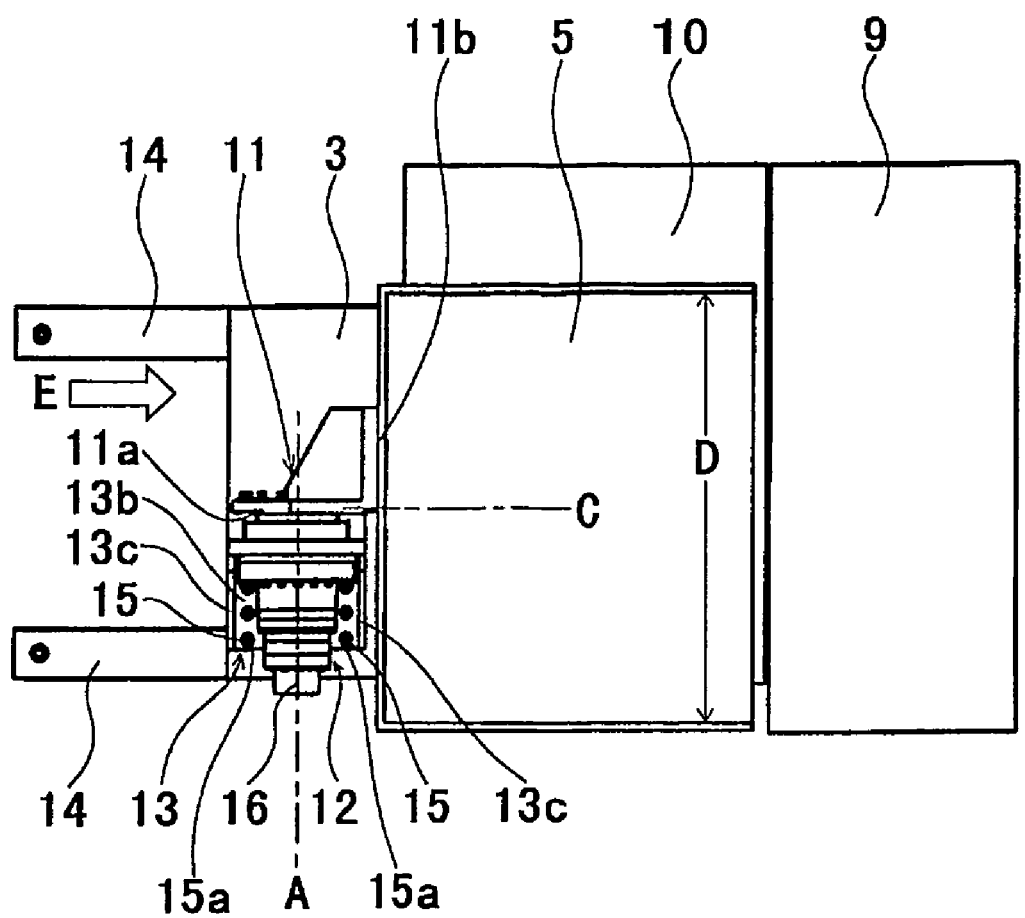
FIG. 2 is a plan view showing an example of the turning device for a heavy object according to the present invention, taken from FIG. 1.

The test head 5 is fixed onto a rotating shaft of a drive device 12 through a turning arm 11 having a first plane 11a and a second plane 11b orthogonal to the first plane 11a as shown in FIG. 2, and is structured so as to turn through the rotating shaft. The turning arm 11 is connected to the test head 5 as a heavy object and turns around a turning fulcrum on the axial line A of the rotating shaft of the drive device 12. The drive device 12 drives a turning operation of the turning arm 11 and is installed on the top of the frame 3 through a supporting block 13. The supporting block 13 has a fixing section of the drive device 12 or a planetary gear type speed reducer stored in the drive device 12, that is, a first mounting surface 13a mounted on a mounting flat surface of a stationary case 28, a second mounting surface 13b orthogonal to the first mounting surface 13a, and a pair of rib sections 13c, 13c for connecting both ends of the first mounting surface 13a in the outward direction with both ends of the second mounting surface 13b in the outward direction.

The fixing section of the drive device 12 or the planetary gear type speed reducer stored in the drive device 12, that is, the outside diameter section of the mounting flat surface of the stationary case 28 is formed with cut sections 28a, 28a on the pair of rib sections 13c, 13c. As a result, the fixed section of the planetary gear type speed reducer, that is, the pair of rib sections 13c, 13c of the mounting flat surface outside diameter section of the stationary case 28 are cut, so that the first mounting surface 13a and the second mounting surface 13b of the supporting block 13 can be reinforced by the pair of rib sections 13c, 13c, thus making the supporting block 13 robust, without lengthening a section between the second plane 11b of the turning arm 11 and the axial line A of a turning pivot, or without increasing a turning radius of a heavy weight such as the test head 5.

Figure 3:
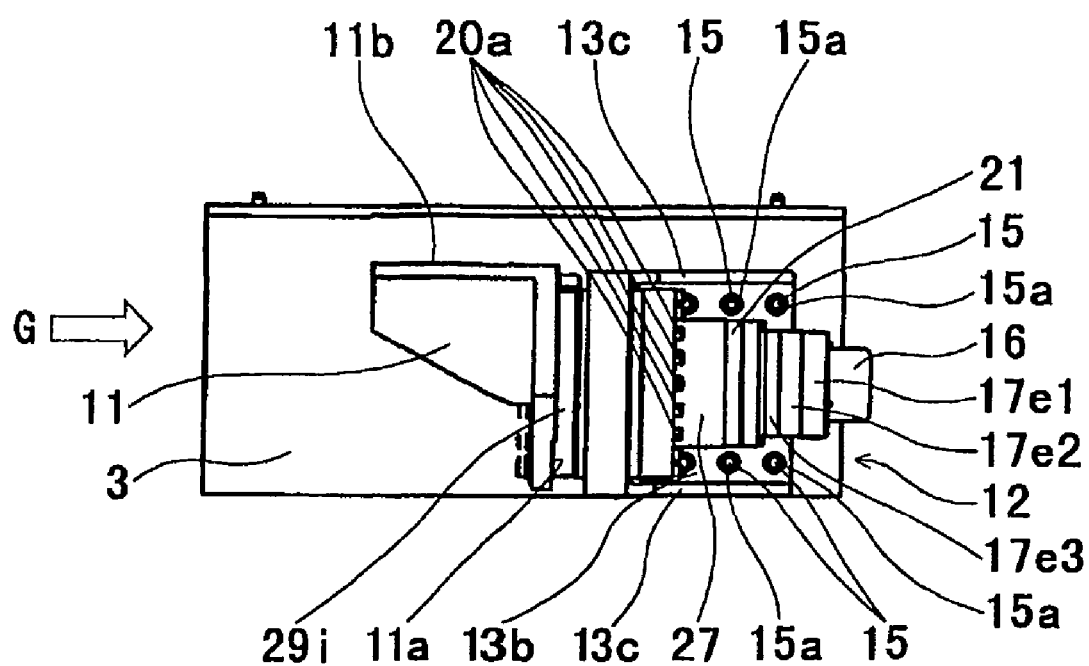
FIG. 3 is a side view showing a frame and a drive device of the turning device for a heavy object according to the present invention, as viewed in an arrow E direction shown in FIG. 2.

A reference numeral 14 used in the figure denotes an installation block for installing the frame 3 storing a controller therein. Reference numerals 15, 15 denote bolts, which are inserted into slightly elongated clearance holes 15a, 15a in FIGS. 2 and 3 formed in the second mounting surface 13b to locate the second mounting surface 13b from front to back and from side to side and fix the supporting block 13 on the frame 3. A reference numeral 16 denotes a cover disposed on the front of an encoder for detecting the rotational position and speed of a motor 17 described later.

Figure 4:
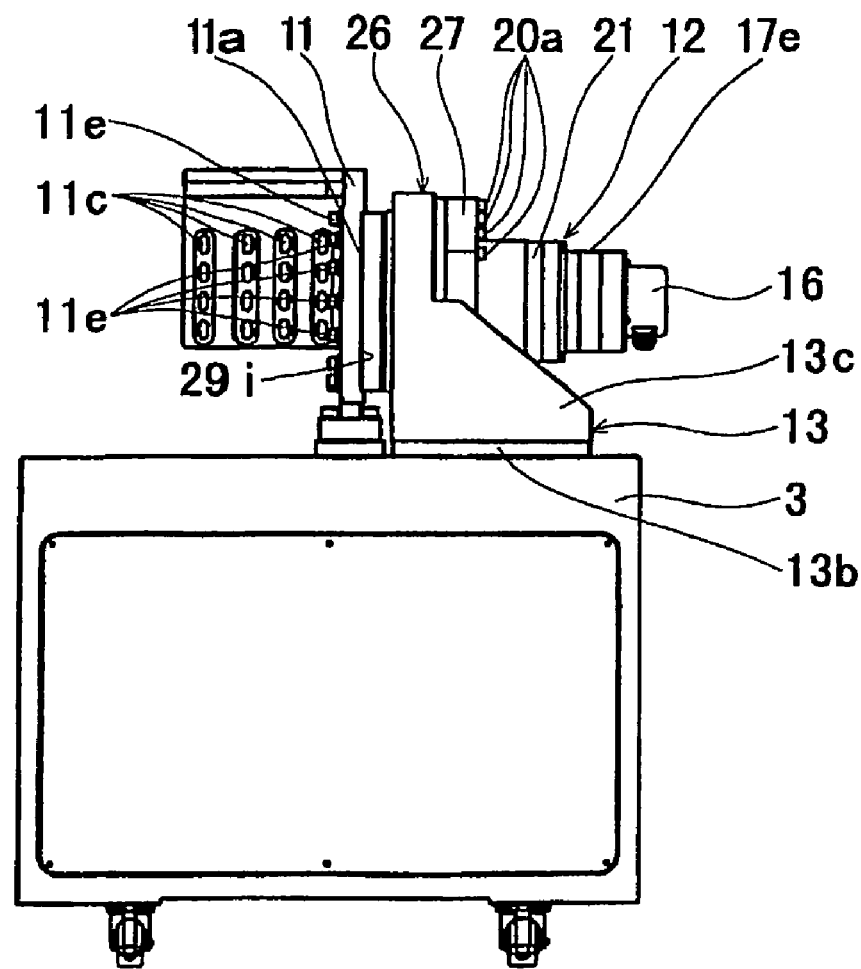
FIG. 4 is a side view showing an example of the turning device for a heavy object according to the present invention, taken from an arrow F direction shown in FIG. 1.
Figure 5:
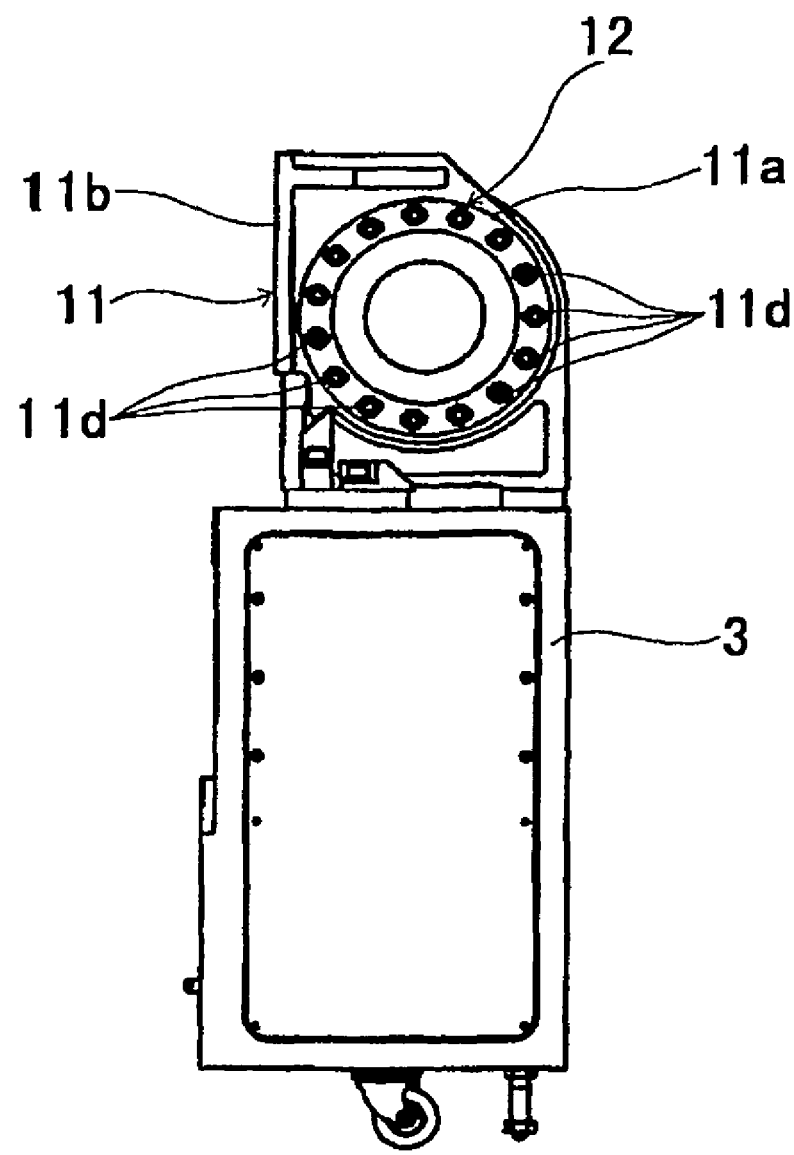
FIG. 5 is a side view illustrating the frame and the drive device of the turning device for a heavy object according to the present invention, as viewed in an arrow G direction shown in FIG. 3.

As shown in FIGS. 4 and 5, a rotation output section of the drive device 12 is formed with the first plane 11a of the turning arm 11. The second plane 11b of the turning arm 11 is drilled with slots 11c, 11c, . . . , for example, in four rows, into which bolts (not shown) are screwed, and the turning arm is fixed on the test head 5 with its vertical position adjusted to the position of the test head 5.

Figure 6:
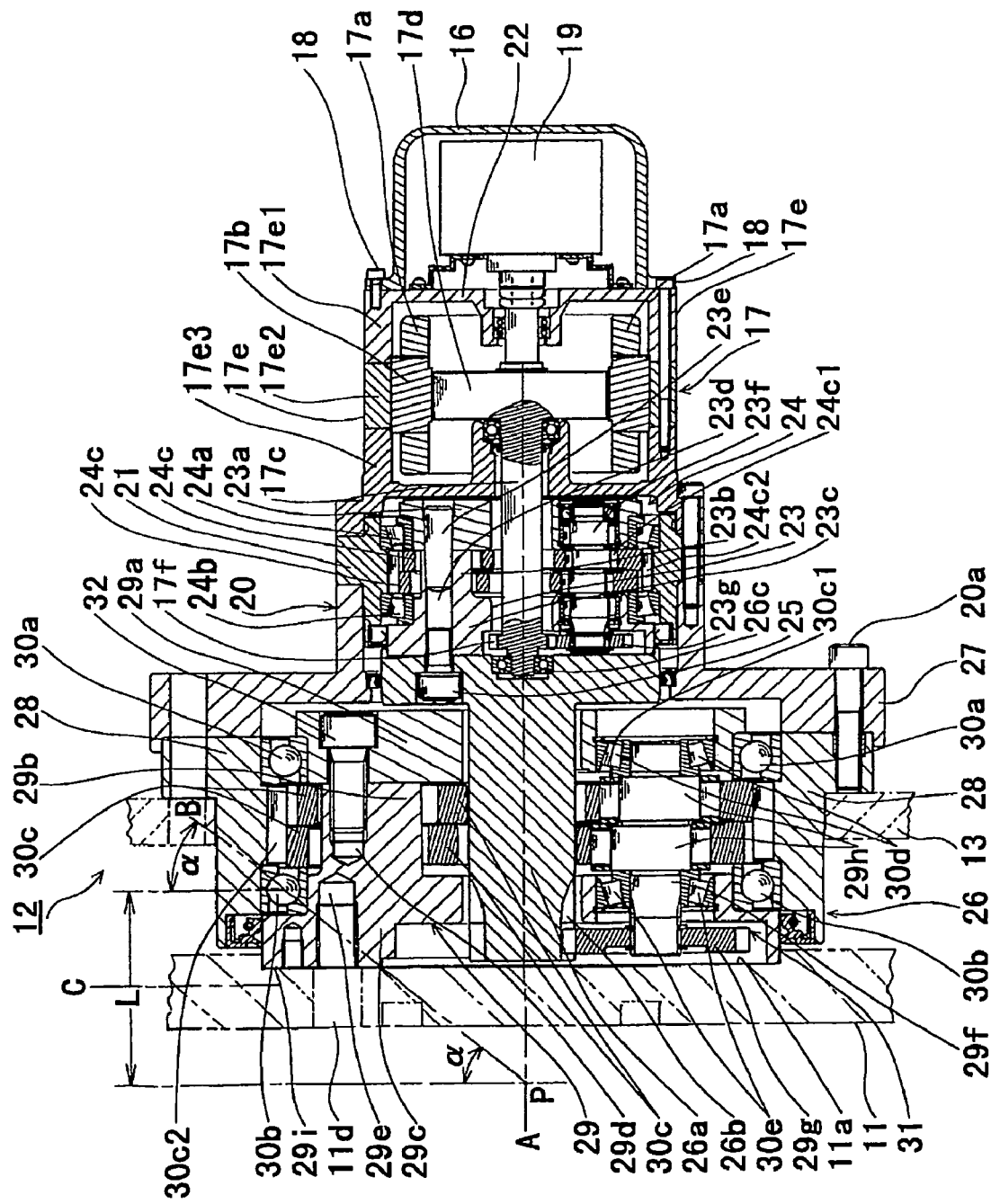
FIG. 6 is a vertical sectional view showing an example of the drive device in the turning device for a heavy object according to the present invention.

Referring next to the drawings, and particularly to FIG. 6, the drive device 12 will be described below in detail.

The drive device 12 is roughly composed of: the motor 17, reduction gear mechanisms for performing decelerating rotation by driving the motor 17 and an encoder 19 for detecting the rotational position and speed of the motor 17. As the reduction gear mechanism, a single reduction gear mechanism may be used. The drive device includes a previous-stage reduction gear mechanism for firstly decelerating the rotational speed of the motor 17 and a subsequent-stage reduction gear mechanism for further secondly decelerating the rotational speed by the previous stage reduction gear mechanism.

The drive device 12 shown in FIG. 6 is a structural example which includes two reduction gear mechanisms, which are two planetary gear type speed reducers for previous-stage speed reduction and subsequent-stage speed reduction.

A reference numeral 17 denotes a motor, which includes: a cylindrical stator 17b having a coil section 17a, a rotor 17d having a rotatably supported rotor shaft 17c and disposed inside the stator; and a motor case 17e housing the stator 17b from the outside. The motor case 17e is composed of a first, a second and a third cases 17e1, 17e2 and 17e3, which are connected to each other. The front section of the first case 17e1 is firmly covered by fixing bottom ends of the box-shaped cover 16 with bolts 18, 18. A rotor shaft of the encoder 19 is connected directly to the other side of the rotor 17d. A reference numeral 22 is a front wall of the first case 17e1.

A reference numeral 20 denotes a front-stage speed reducer, which mainly consists of: a cylindrical inner teeth gear body 21 serving as a fixed section having a plurality of internal teeth pins 24c2 as internal teeth on an inner-periphery section; a pair of external teeth gear 24c of which external teeth of peritrochoide tooth profile mesh with the internal teeth pins 24c2 of the internal teeth gear body 21 for eccentric oscillation; a pinion gear 17f formed on the rotor shaft 17c as an input section; a shaft 23 as a rotation output section; and a planetary gear type speed reducer 24 having main bearings 24a, 24b as a pair of ball bearings at the previous and subsequent stages disposed between the internal teeth gear body 21 and the shaft 23.

The shaft 23 is composed of a first end plate 23a whose outer-periphery surface engages with the pair of main bearings 24a at the previous stage and a second end plate 23c having a column section 23b loosely fitted into the internal teeth gear body 21, whose outer-periphery surface engages with the pair of main bearings 24b at the subsequent stage.

The first end plate 23a, the second end plate 23c having the column section 23b and a rotor shaft 26a described later are connected adjacent to each other by a taper pin 23e and a bolt 25 penetrated into a shaft hole 23d formed therein. A spur gear 23g provided at a crank shaft 23f meshes with a previous-stage pinion gear 17f. The crank shaft 23f is rotatably supported on the first end plate 23a and the second end plate 23c and engages with the external teeth gear 24c through a needle bearing 24c1. Rotation of the rotor shaft 17c is decelerated between the pinion gear 17f and the spur gear 23g and is transmitted to the crank shaft 23f. Rotation of the crank shaft 23f eccentrically oscillates the external teeth gear 24c, and decelerates and rotates the shaft 23.

The upper front of the internal teeth gear body 21 is connected adjacent to a third case 17e3 of the motor case 17e and the upper rear of the internal teeth gear body 21 is connected adjacent to a cylindrical connection member 27 in which an outer surface joined to a subsequent-stage speed reducer 26 described later is formed into a stepped shape, by a bolt 20a respectively.

Next, the subsequent-stage speed reducer 26 will be described below:

The subsequent-stage speed reducer 26 consists of: a cylindrical internal teeth gear body 28 as a fixed section having a plurality of internal teeth pins 30c2 as internal teeth mainly on the inner-periphery section; a pair of external teeth gear 30c in which external teeth of peritrochoid tooth profile mesh with the internal teeth pins 30c2 of the inner teeth gear body 28 for eccentric oscillation; a pinion gear 26b formed on the rotor shaft 26a as a rotation input section; a shaft 29 as a rotation output section; and planetary gear type speed reducer 31 having main bearings 30a, 30b as a pair of ball bearings at the previous and subsequent stages disposed between the inner teeth gear body 28 and the shaft 29. The rotor shaft 26a is connected to the second end plate 23c.

The shaft 29 is composed of a first end plate 29a engaging the pair of main bearings 30a at the previous stage with an outer-periphery surface thereof and a second end plate 29c having a column 29b loosely fitted into the inner teeth gear body 28 and engaging the pair of main bearings 30b at the subsequent stage with an outer-periphery surface thereof.

The first end plate 29a and a second end plate 29c having the column section 29b are connected adjacent to each other by a taper pin (not shown) penetrated into shaft holes 29d formed therein and a bolt 32. The previous-stage pinion gear 26b is meshed with a spur gear 29g provided on a crank shaft 29f. The crank shaft 29f is rotatably supported on the first end plate 29a and the second end plate 29c and is engaged with the external teeth gear 30c through a needle bearing 30c1. Rotation of the rotor shaft 26a is decelerated between a pinion gear 26b and the spur gear 29g and transmitted to the crank shaft 29f. Rotation of the crank shaft 29f eccentrically oscillates the external teeth gear 30c and decelerates and rotates the shaft 29. A reduction ratio of the previous-stage speed reducer 26 is set at, for example, approximately 1/100.

Accordingly, to an orthogonal plane 29i orthogonal to the axial line A of the turning pivot of the turning arm 11 of the second end plate 29c, the turning arm 11 is connected by a bolt (not shown).

The turning arm 11 includes a first plane 11a connected to the plane of the shaft 29 as a rotation output section, namely, the second end plate 29c and a second plane 11b which is connected to a heavy object formed out of the test head 5 and so on and which is orthogonal to the first plane 11a positioned nearer to the heavy object than the axial line A of the turning pivot. As shown in FIG. 2, the turning arm 11 and the drive device 12 are disposed within a width D of the heavy object 5 in the axial direction of the turning pivot of the turning arm 11. A dashed line C indicates the center position of the test head 5 as a heavy object in the direction of the axial line A. This can constitute a compact turning device for a heavy object which can reduce a distance between the center of gravity and the turning pivot of the heavy object such as the test head 5 on the axial line A and which allows the turning arm 11 and the drive device 12 to be positioned within the width D of the turning pivot of the heavy object in the direction of the axial line A.

The center position C along the direction of the axial line A of the turning pivot of the turning arm 11 of the heavy object, such as the test head 5, is set within a distance L between the main bearing 30b as a ball bearing positioned on the orthogonal plane side of a rotation output section, out of the pair of ball bearings, and an intersection P obtained by crossing the axial line A of the turning pivot with a line B which forms a bearing contact angle a (°) to the perpendicular line of the main bearing 30b. Preferably, the contact angle a (°) is to be set within the range from) 35(°) to 45(°). Such a configuration can support a heavy object such as the test head 5 in a cantilever manner and stably turn the heavy object.

On the first plane 11a side of the turning arm 11, bolt insertion holes 11d, 11d, . . . having slightly longer diameter are circumferentially arranged at desired intervals as shown in FIG. 5. By screwing bolts 11e, 11e . . . shown in FIG. 4 into the bolt insertion holes 11d, 11d . . . , to engage shaft holes 29e (see FIG. 6), vertical or horizontal positioning movement of the drive device 12 in the rotational direction is adjusted to fix it to the turning arm 11.

Next, there is illustrated the operation of the turning device for a heavy object according to the present invention.

The motor 17 rotates at a high speed so that a turning operation of a heavy object such as the test head 5 may be driven between a position indicated by a solid line and a position indicated by a virtual line as shown in FIG. 1. Thus, the rotor 17d rotates at a high speed inside the cylindrical stator 17b to rotate the rotor shaft 17c connected directly to the rotor 17d and supported by a bearing 26c. A rotational force is transmitted to the spur gear 23g engaged with the pinion gear 17f formed on the rear end of the rotor shaft 17c and, by the rotation of the spur gear 23g, the crank shaft 23f having a crank section in the rough center rotates while being supported by a pair of bearings disposed on the shaft 23.

A rotational force of the crank shaft 23f is transmitted to the external teeth gears 24c, 24c configured in two rows adjacent to each other, and the rotation action of the external teeth gears 24c, 24c decelerates the first end plate 23a and the second end plate 23c having the column section 23b of the shaft 23 as a rotation output section. The second end plate 23c transmits the rotational force to the subsequent-stage speed reducer 26 by the bolt 25. Hence, the previous-stage speed reducer 20 decelerates the rotational speed of the motor 17, for example, to approximately 1/60 by the planetary gear type speed reducer 24.

Next, a rotational force of the shaft 23 decelerated to the first stage as described above is transmitted to the rotor shaft 26a as a rotation input section, and the rotor shaft 26a rotates at a speed decelerated by the previous-stage speed reducer 20. A rotational force is transmitted to the spur gear 29g engaged with a pinion gear 26b formed on the rear end of the rotor shaft 26a. By the rotation of the spur gear 29g, the crank shaft 29f having a crank section 29h in the rough center rotates while being supported by main bearings 30d, 30e disposed adjacent to each other in front of the spur gear 29g. A rotational force of the crank shaft 29f is transmitted to the external teeth gears 30c, 30c configured in two rows adjacent to each other. The rotation action of the external teeth gears 30c, 30c further decelerates the rotation of the first end plate 29a and the second end plate 29c having the column 29b of the shaft 29 as a rotation output section. The second end plate 29c is connected to the first plane 11a of the turning arm 11 so as to be adjacent to each other by the bolts 11e, 11e, . . . to decelerate the driving force of the turning arm 11.

Accordingly, a heavy object such as the test head 5 is adjusted while the rotational position or speed of the motor 17 is detected by the encoder 19 to be rotationally driven with an angle of approximately 180° from a position indicated by a virtual line to a position indicated by a solid line shown in FIG. 1. The test head 5 is electrically connected to a contact on the top of the probe card 8 through an adjacent ring. The probe device 1 receives a test signal from a tester by an electrode of a semiconductor wafer on a mounting block through the test head 5 and a probe pin of the probe card 8 for electrical examination of respective IC chips of the semiconductor wafers.

Hence, the subsequent-stage speed reducer 26 decelerates the rotational speed of the previous-stage speed reducer 20, for example, to approximately 1/100, and decelerates the rotational speed of the motor 17, for example, to approximately 1/6000. The high reduction ratio obtained by the two-stage reduction gear mechanism can reduce the outside diameter of each of the previous-stage and subsequent-stage speed reducers 20, 26 and the motor 17, which can further reduce the turning radius of a heavy object such as the test head 5. A value of the reduction ratio can be selected by setting design dimensions and shapes of internal components or members of the planetary gear type speed reducer 31 as appropriate.

The present invention can constitute a turning device for a heavy object of a single speed reducer only for previous stage by fixing the shaft 23 having the said second end plate 29c to the said turning arm 11.

INDUSTRIAL APPLICABILITY

As described above, the turning device for a heavy object according to the present invention is applied to a probe device and the like for measuring the electric characteristics of an object to be examined, such as a semiconductor device.

What is claimed is:

1. A turning device for a heavy object comprising:
a turning arm joined to the heavy object, said turning arm being turnable around an axial line of a turning pivot of the turning arm, said heavy object having a width extended along the axial line of the turning pivot; and
a drive device for driving a turning operation of the turning arm, the drive device including
a planetary gear type reducer comprising a fixing section, a rotation input section, and a rotation output section having a plane orthogonal to the axial line of the turning pivot, said planetary gear type reducer including a pair of ball bearings each having bearing contact angle to a line perpendicular to the axial line, said ball bearings being disposed between the fixing section and the rotation output section; and
a motor including a rotor shaft coaxially connected to a stator having a coil and to the rotation input section, the turning arm having a first plane connected to the plane of the rotation output section and a second plane connected to the heavy object, said second plane being positioned nearer to the heavy object than the axial line of the turning pivot and oriented orthogonal to the first plane, and the turning arm and the drive device being disposed entirely within said width of the heavy object.

2. The turning device for a heavy object according to claim 1 wherein:
an axial center of the turning pivot is positioned within a distance, said distance extending between one of the pair of ball bearings which is positioned on a side of the rotation output section proximal to said first plane and an intersection obtained by crossing the axial line of the turning pivot with a line at said bearing contact angle of the one of the pair of ball bearings.

3. The turning device for a heavy object according to claim 1 wherein:
a previous-stage speed reducer as a previous-stage reduction gear mechanism is disposed between the planetary gear type speed reducer and the motor;
an input rotation section of the previous-stage speed reducer and the rotor shaft of the motor are coaxially coupled to each other; and
an output rotation section of the previous-stage speed reducer and the input rotation section of the planetary gear type speed reducer are coaxially coupled to each other.

4. The turning device for a heavy object according to claim 1, wherein:
a supporting block for fixing the planetary gear type speed reducer and a frame for mounting the supporting block are provided;
the fixing section for the drive device or the planetary gear type speed reducer having a mounting flat surface parallel to the plane of the rotation output section which includes a circular outside-diameter section;
the supporting block includes a first mounting surface for mounting the mounting flat surface of the fixing section of the planetary gear type speed reducer, a second mounting surface for mounting the frame and orthogonal to the first mounting surface, and a pair of rib sections for connecting outer ends of the first mounting surface with corresponding outer ends of the second mounting surface; and
the outside-diameter section of the mounting flat surface of the fixing section is cut so that a side of the pair of rib sections may be shorter than a circular outside diameter of said outside-diameter section.

5. A turning device for a heavy object comprising:
a turning arm joined to the heavy object and turning around an axial, line of a turning pivot of the turning arm, said heavy object having a width extended along the axial line of the turning pivot; and
a drive device for driving a turning operation of the turning arm, the drive device including:
a planetary gear type reducer comprising a fixing section, a rotation input section, and a rotation output section having a plane orthogonal to the axial line of the turning pivot, said planetary gear type reducer having a pair of ball bearings each having bearing contact angle to a line perpendicular to the axial line, said ball bearings being disposed between the fixing section and the rotation output section; and
a motor disposed coaxially to the rotation input section, the turning arm having a first plane joined to the plane of the rotation output section and a second plane orthogonal to the first plane, the turning arm and the drive device being disposed entirely within said width of the heavy object.

* * * * *